US006674291B1

United States Patent
Barber et al.

(10) Patent No.: US 6,674,291 B1
(45) Date of Patent: Jan. 6, 2004

(54) METHOD AND APPARATUS FOR DETERMINING AND/OR IMPROVING HIGH POWER RELIABILITY IN THIN FILM RESONATOR DEVICES, AND A THIN FILM RESONATOR DEVICE RESULTANT THEREFROM

(75) Inventors: Bradley Paul Barber, Chatham, NJ (US); Peter Ledel Gammel, Milburn, NJ (US); Juan A. Herbsommer, de Bariloche (AR); Hugo F. Safar, Westfield, NJ (US); Yiu-Huen Wong, Summit, NJ (US)

(73) Assignee: Agere Systems Guardian Corp., Allentown, PA (US)

( * ) Notice: Subject to any disclaimer, the term of this patent is extended or adjusted under 35 U.S.C. 154(b) by 131 days.

(21) Appl. No.: 09/669,681

(22) Filed: Sep. 26, 2000

(51) Int. Cl.[7] .................................................. G01R 27/02
(52) U.S. Cl. .................... 324/520; 324/76.49; 324/633; 324/652; 324/708
(58) Field of Search .............................. 324/76.49, 618, 324/520, 727, 76.51, 633, 652, 655, 668, 675, 682, 708; 333/187, 188, 189, 202, 234

(56) References Cited

U.S. PATENT DOCUMENTS

| 4,502,932 A | 3/1985 | Kline et al. |
| 4,556,812 A | 12/1985 | Kline et al. |
| 4,719,383 A | 1/1988 | Wang et al. |
| 4,890,370 A | 1/1990 | Fukuda et al. |
| 4,988,957 A | 1/1991 | Thompson et al. |
| 5,075,641 A | 12/1991 | Weber et al. |
| 5,166,646 A | 11/1992 | Avanic et al. |
| 5,231,327 A | 7/1993 | Ketcham |
| 5,232,571 A | 8/1993 | Braymen |
| 5,263,259 A | 11/1993 | Cimador |
| 5,283,458 A | 2/1994 | Stokes et al. |
| 5,294,898 A | 3/1994 | Dworsky et al. |
| 5,303,457 A | 4/1994 | Falkner, Jr. et al. |
| 5,334,960 A | 8/1994 | Penunuri |
| 5,348,617 A | 9/1994 | Braymen |
| 5,367,308 A | 11/1994 | Weber |
| 5,373,268 A | 12/1994 | Dworsky et al. |
| 5,381,385 A | 1/1995 | Greenstein |
| 5,403,701 A | 4/1995 | Lum et al. |
| 5,404,628 A | 4/1995 | Ketcham |
| 5,438,554 A | 8/1995 | Seyed-Bolorforosh et al. |
| 5,446,306 A | 8/1995 | Stokes et al. |
| 5,552,655 A | 9/1996 | Stokes et al. |
| 5,587,620 A | 12/1996 | Ruby et al. |

(List continued on next page.)

Primary Examiner—N. Le
Assistant Examiner—Vincent Q. Nguyen
(74) Attorney, Agent, or Firm—Harness, Dickey & Pierce, P.L.C.

(57) ABSTRACT

The effects of electromigration have been shown to lead to damage of metal electrodes of electronic devices such as thin film resonator (TFR) devices in only a few hours, for a test input power that is within the operational range of these devices. It has been determined that this failure is sensitive to the frequency of the input power. The present invention provides a method and apparatus for determining high power reliability in electronic devices, so as to enable an accurate determination of the failure time of the electronic device, and hence projected lifetime. This determination is independent from the frequency of an input power applied to the electronic device as part of the method for testing the device. Based on the above results, a TFR device has been developed, which includes a protective or electromigration-reducing layer such as titanium being deposited atop an electrode of the device. The TFR device with the modified electrode structure can operate at higher power levels and has a longer operational lifetime than what is currently available.

23 Claims, 11 Drawing Sheets

U.S. PATENT DOCUMENTS

| | | |
|---|---|---|
| 5,596,239 A | 1/1997 | Dydyk |
| 5,617,065 A | 4/1997 | Dydyk |
| 5,630,949 A | 5/1997 | Lakin |
| 5,646,583 A | 7/1997 | Seabury et al. |
| 5,692,279 A | 12/1997 | Mang et al. |
| 5,698,928 A | 12/1997 | Mang et al. |
| 5,702,775 A | 12/1997 | Anderson et al. |
| 5,714,917 A | 2/1998 | Ella |
| 5,760,663 A | 6/1998 | Pradal |
| 5,780,713 A | 7/1998 | Ruby |
| 5,789,845 A | 8/1998 | Wadaka et al. |
| 5,821,833 A | 10/1998 | Lakin |
| 5,853,601 A | 12/1998 | Krishaswamy et al. |
| 5,864,261 A | 1/1999 | Weber |
| 5,869,958 A * | 2/1999 | Gallop et al. ............... 324/618 |
| 5,872,493 A | 2/1999 | Ella |
| 5,873,153 A | 2/1999 | Ruby et al. |
| 5,873,154 A | 2/1999 | Ylilammi et al. |
| 5,883,575 A | 3/1999 | Ruby et al. |
| 5,884,378 A | 3/1999 | Dydyk |
| 5,894,647 A | 4/1999 | Lakin |
| 5,910,756 A | 6/1999 | Ella |
| 5,928,598 A | 7/1999 | Anderson et al. |
| 5,942,958 A | 8/1999 | Lakin |
| 5,963,856 A | 10/1999 | Kim |
| 6,051,907 A | 4/2000 | Ylilammi |
| 6,060,818 A | 5/2000 | Ruby et al. |
| 6,081,171 A | 6/2000 | Ella |
| 6,087,198 A | 7/2000 | Panasik |
| 6,127,768 A | 10/2000 | Stoner et al. |
| 6,150,703 A | 11/2000 | Cushman et al. |
| 6,185,589 B1 | 2/2001 | Votipka |
| 6,198,208 B1 | 3/2001 | Yano et al. |
| 6,204,737 B1 | 3/2001 | Ella |
| 6,215,375 B1 | 4/2001 | Larson, III et al. |

* cited by examiner

METHOD AND APPARATUS FOR DETERMINING AND/OR IMPROVING HIGH POWER RELIABILITY IN THIN FILM RESONATOR DEVICES, AND A THIN FILM RESONATOR DEVICE RESULTANT THEREFROM

FIELD OF THE INVENTION

The present invention relates to electronic devices such as thin film resonator (TFR) devices, more particularly to a method and apparatus for determining and/or improving high power reliability in these devices, and a thin film resonator (TFR) device developed from the results.

DESCRIPTION OF THE RELATED ART

Thin film resonators (hereinafter "TFR") are typically used in high-frequency, high-power environments ranging from several hundred megahertz (MHz) to several gigahertz (GHz). FIG. 1 illustrates a side view or cross-section of a typical TFR component 100. In FIG. 1, TFR component 100 includes a piezoelectric material 110 interposed between two conductive electrode layers 105 and 115, with electrode layer 115 formed on a support structure 120. The support structure 120 may be a membrane, or may be a plurality of alternating reflecting layers on a solid semiconductor substrate which may be made of silicon or quartz, for example. The piezoelectric material is preferably one selected from the group comprising at least ZnO, CdS and AlN. Electrode layers 105 and 115 are formed from a conductive material, preferably of Al, but may be formed from other conductors as well.

TFRs are often used in electronic signal filters, more particularly in TFR filter circuits applicable to a myriad of communication and microelectronic technologies. For example, TFR filter circuits may be employed in cellular, wireless and fiber-optic communications, as well as in computer or computer-related information-exchange or information-sharing systems.

The piezoelectric material in TFR resonators converts electrical to mechanical energy and vice versa, such that at its mechanical resonance frequency, the electrical behavior of the device abruptly changes. Electrical signals of particular frequencies easily pass thorough the resonators, while others will not be transmitted. These particular frequencies can typically be dictated by choosing resonator size and design. Resonators of certain sizes and design frequencies can be networked in appropriate combinations, such that they will impose desired filtering functions on signals passing through the network.

A standard approach to designing filters out of resonators is to arrange them out of simple building blocks such as in a ladder configuration alternately in a series-shunt relationship. A series element in this sense carries signal from an input toward an output, whereas a shunt element provides an alternative path for the signal to ground. The transmission or blocking characteristics of both series and shunt elements affect the final signal reaching output from input, somewhat analogous to how branching of water pipes can affect the flow through the main water line.

FIG. 2 illustrates schematically this simple building block, commonly known as a T-Cell. Referring specifically to FIG. 2, a schematic of a T-Cell building block 200 includes three TFR components 210, 220 and 230. TFR components 210 and 220 comprise the "series arm" portion of the T-Cell block, being connected in series between an input port 215 and an output port 225 of T-Cell 200. TFR component 230 comprises the "shunt leg" portion of T-Cell 200, being connected in shunt between node 235 and ground. A TFR T-Cell itself may define a filter; although a TFR ladder filter typically has a plurality of these T-cells concatenated together.

Each of the shunt and series TFR components 210, 220 and 230 in the schematic T-Cell of FIG. 2 has a set of characteristic frequencies: a "pole" frequency and a "zero" frequency. The terms refer to the magnitude of the impedance to current flow through the device; impedance is low at the zero and high at the pole. The series and shunt arms in a filter typically have zero and pole frequencies slightly shifted from each other.

However, for these TFRs, as for many electronic components across the scope of microelectronic technology, one of the most serious and persistent problems has been the effects of electromigration on a component's performance and reliability. Generally, electromigration damage is characterized by the formation of growth and voids in a metal of an electronic component. During the 1960's, it was recognized that electromigration could cause void formation in Al interconnects of integrated circuits, leading to open circuit failure. Since then, many studies have been performed in an effort to understand the nature of electromigration, and a substantial amount of literature has been written on the subject.

A major effort has been made to solve this problem in silicon (Si) very large-scale integration technology. In fact, as on-chip device packaging densities increase, interconnect line widths must accordingly decrease; this translates into ever-higher interconnect current densities. Not only are the electromigration effects present at interconnections, but these effects are also present in any device where a film of metal (Al for example) is used as a connector or an electrode, and which has a high current density passing therethrough.

Accordingly, electromigration and its effects are likely present in the Al electrodes of many, if not all, TFR devices, particularly those used as duplex filters in wireless communication applications. This may affect the reliability of these devices in their typical high power environments, particularly regarding the power handling characteristics and expected lifetime of the TFR devices, for example. Accordingly, what is needed is a method and apparatus for testing these devices to determine the effects of electromigration thereon, in an effort to determine possible solutions to counter-balancing or avoiding the adverse effects that electromigration might have on overall TFR device performance.

SUMMARY OF THE INVENTION

The present invention provides a method and apparatus for determining high power reliability in electronic devices. In an aspect of the method, the frequency of the input power supplied to the electronic device to be tested is swept in a specified range of frequencies, so that the input power is applied to the operational frequency band of the device, including the resonant zero of the device. This technique enables a measure of reliability of the device to be determined, such as the failure time of the electronic device (and hence projected lifetime) that is independent from the frequency of the input power.

Another aspect of the invention provides a thin film resonator device that has been developed based on the results of the test. The TFR device includes a protective layer or film that is deposited on top of an aluminum electrode of the TFR. This protective layer protects the electrode against the effects of electromigration damage. The resultant TFR device with the modified electrode structure delays the time to failure by increasing the critical current density above which the TFR device may be damaged due to electromigration, thereby providing a TFR device having a longer lifetime than, and able to operate at higher operational powers than conventional devices.

BRIEF DESCRIPTION OF THE DRAWINGS

The present invention will become fully understood from the detailed description given hereinbelow and the accompanying drawings, wherein like elements represent like reference numerals, which are given by way of illustration only and thus are not limitative of the invention and wherein.

DETAILED DESCRIPTION

Figure 1:
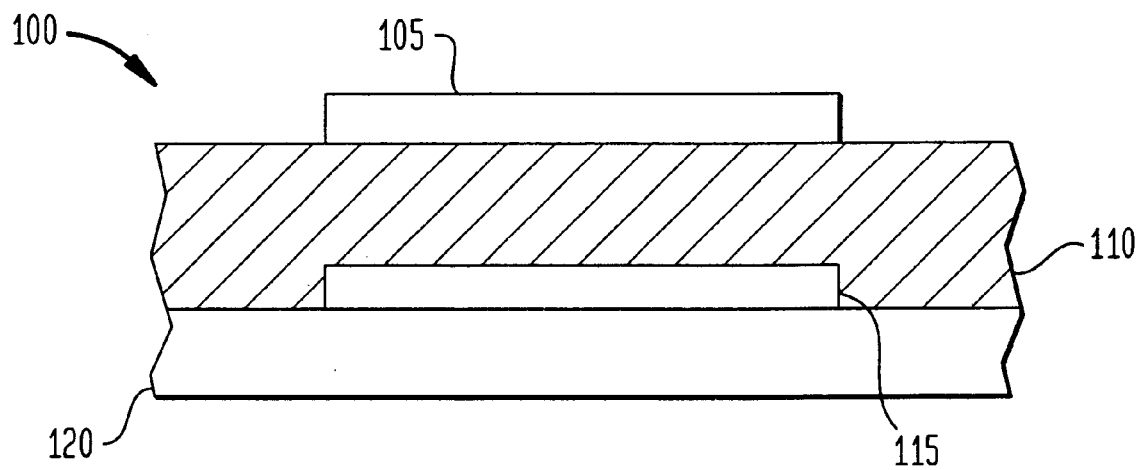
FIG. 1 is a side view of a conventional thin film resonator.

The present invention provides a method and apparatus for determining high power reliability in electronic devices, so as to enable an accurate determination of the failure time of the device (and hence projected lifetime) that is independent from the frequency of an input power applied to the device as part of the test.

In accordance with the above results, a thin film resonator device has been developed, which includes a electromigration-reducing layer deposited on top of at least one of the electrodes of the device. The TFR device with the modified electrode structure is advantageous in that it has been shown to lengthen the device lifetime, by extending time to failure due to the possible adverse effects of electromigration.

As will be more fully described below, it has been determined that electromigration in the Al electrodes of TFR devices causes damage to the device when operating at expected power levels for these devices, such as about 23–30 dBm for duplexer filters, for example. This damage leads to a complete failure in the performance of the filter and is a problem that should be solved in order to use these filters in wireless devices.

Although the experiments and testing were performed on a specific electronic device (TFR), the method and apparatus of the invention is applicable to any electronic device having a resonant frequency at which the properties of the device change (e.g. the electrical impedance), and that is designed to operate in a frequency window around that resonance.

In accordance with the present invention, it has been observed that, for a given power level, electromigration-induced damage is very dependent on the frequency of the input power. The damage is at or near a maximum when the frequency is very close to the zero resonant frequency of the TFR device, while it is at or near a minimum at other frequencies (e.g., the inventors have determined that time to failure may increase up to several orders of magnitude for frequencies greater than the pole resonant frequency of the device). Thus, to fully characterize this failure mode, a method and an apparatus for performing the method of the present invention has been devised—a standard experiment that enables the comparison of various electronic devices such as TFRs, irrespective of their frequency characteristics.

Further, and based on the results of the above method, the inventors illustrate how electromigration or the effects thereof can be minimized or reduced by depositing an electromigration-reducing layer, such as a layer of titanium (Ti), on top of at least one of the Al electrodes which are part of the TFR device. The TFR device of the present invention increases the critical current density (above which electromigration damage is detected) by a factor of five as compared to conventional TFR devices. This buffer zone is expected to be wide enough for many microelectronic technologies and/or communication-based applications employing TFR devices, such as TFR duplexer filters, for example.

As previously noted, electromigration damage is characterized by the formation and growth of voids in the metal. In fact, if the current density passing in the material is higher than a threshold value $J_c$, forces induced on the microstructure of the material begin to deteriorate the microstructure by the formation of voids (hence, the onset of electromigration). These voids grow and migrate at a rate that is strongly dependent on the temperature of the TFR device. As an introductory example, FIGS. 3(a) and 3(b) illustrate the possible electromigration damage which could occur in a TFR device.

Figure 3A:
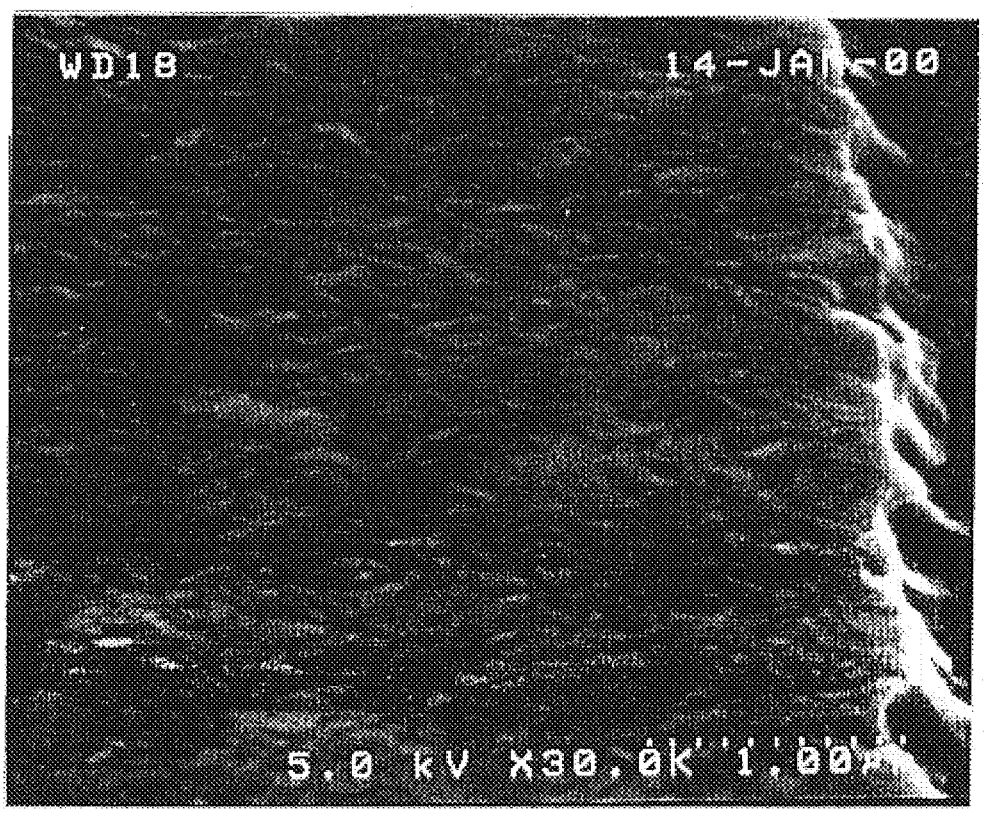
FIG. 3(a) illustrates an SEM image of an Al electrode before electromigration damage.
Figure 3B:
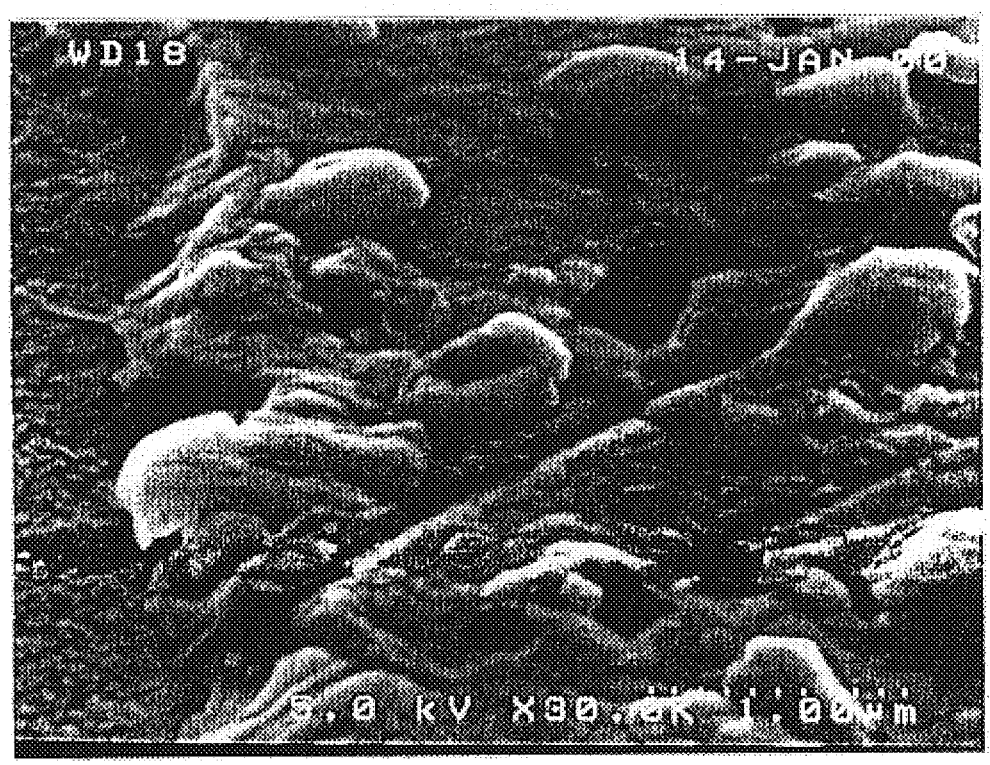
FIG. 3(b) illustrates the SEM image of the electrode in FIG. 3(a) after electromigration damage.

FIGS. 3(a) and 3(b) illustrate Scanning Electron Microscope (SEM) images of an Al electrode in a TFR device both before and after electromigration damage. Initially, it can be seen in FIG. 3(a) that the surface is smooth in the scale of the picture. The device was then tested by applying 0.66 Watts of input power (current density of 3 $10^5$ A/cm$^2$) for seven (7) days. After this, clear damage can be seen on the electrode in FIG. 3(b), with characteristics typical of the damaging electromigration process: holes where the Al material was removed, and neighboring zones in which the removed material is observed on top of the surface.

Figure 4:
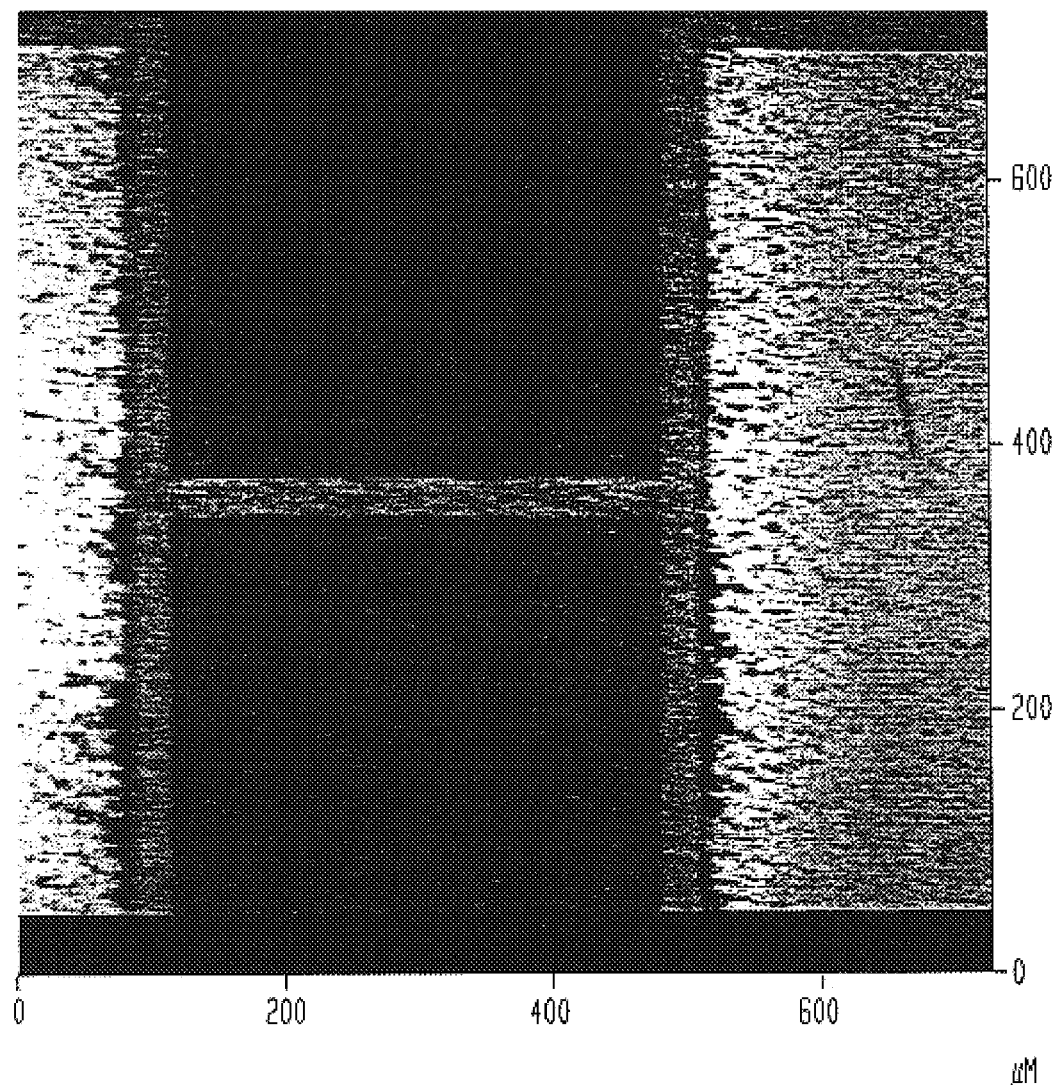
FIG. 4 illustrates an optical image of the Al electrodes in a TFR device.

FIG. 4 illustrates an optical image of the Al electrodes in a TFR device. This image was obtained using a CCD. It is noted that the increment in the roughness of the electrodes substantially changes the reflection of the incident light. The central electrodes (connected to a power source) in FIG. 4 are not reflecting incident light because of the increase in roughness do to electromigration damage, while the lateral electrodes (not connected) are not damaged.

A closer inspection of electrode roughness performed later using an Atomic Force Microscope (AFM) illustrated that the damage to the central electrode is in fact quite severe. For example, taking a height profile along a line in one of the damaged electrodes, it was detected that the average height between peaks and valleys was approximately twice the thickness of the electrode (100 nm in the device of FIG. 4). This implies that pieces as thick as the electrodes themselves were essentially taken out or removed due to the electromigration, and deposited in a nearby zone. This result may indicate that the transport properties of the Al electrodes could be seriously affected due to electromigration damage.

Figure 5:
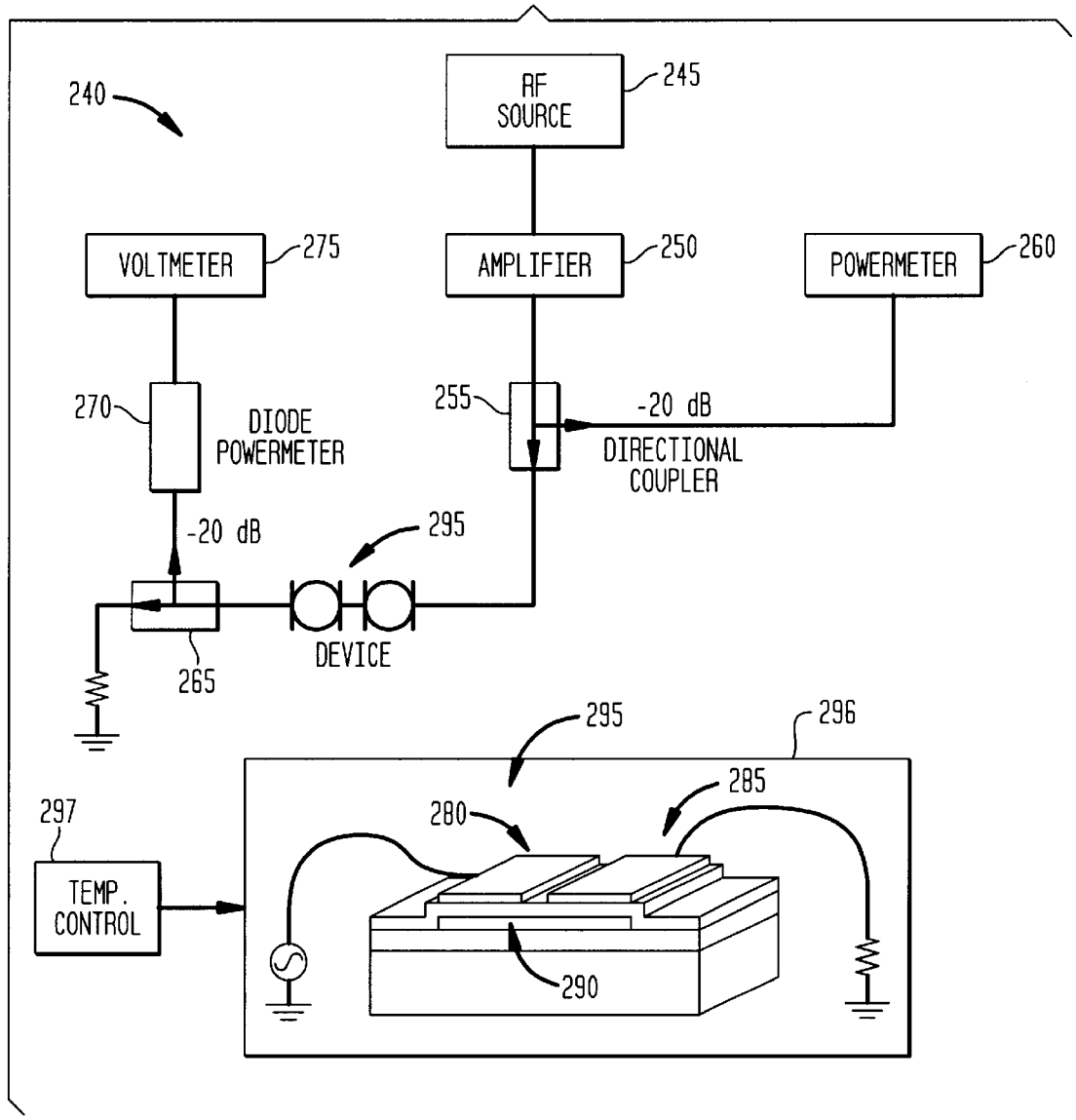
FIG. 5 illustrates an apparatus used in reliability experiments to determine electromigration damage to TFR devices.

FIG. 5 illustrates a testing apparatus used in to perform initial controlled reliability experiments on TFR devices. In FIG. 5, testing apparatus 240 comprises an RF source 245, amplifier 250, power meter 260, voltmeter 275, directional couplers 255 and 265, and diode power meter 270, all of which are configured to test a TFR device 295. Specifically, these experiments were necessary in order to study the dynamics of the electromigration process in TFR devices.

Figure 2:
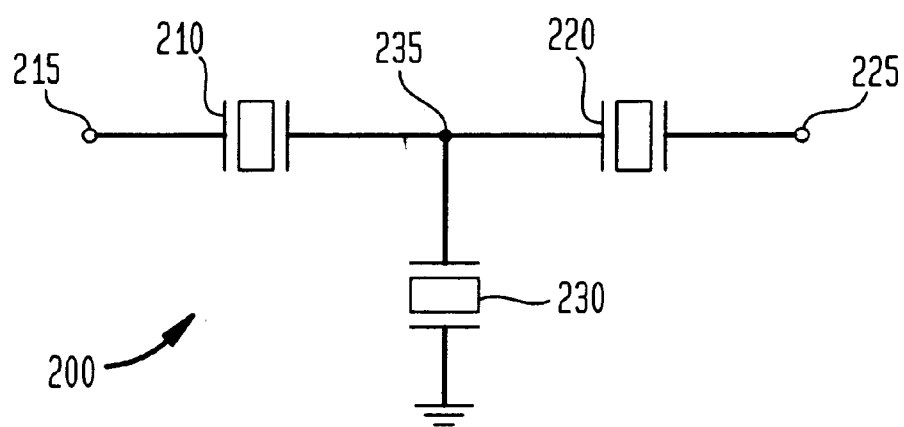
FIG. 2 illustrates a conventional schematic view of a T-Cell building block.

Referring to FIG. 5, RF source 245 may be a Synthesized Signal Generator HP83732B for example, and provides the input power signal to TFR device 295 through a commercial RF amplifier 250. The input power is read using a directional coupler 255 of −20 dB along with power meter 260, which could be a PowerMeter HP5347A, for example. Using a similar directional coupler 265 and a calibrated diode power meter 270, the through voltage is measured by a multimeter 275 (voltmeter), such as a MultiMeter HP3478A. In this arrangement, TFR device 295 has two single resonators (illustrated by top electrodes 280 and 285 for convenience) connected in series through a bottom common electrode 290 (see inset). However, this initial reliability experiment has also been performed on the single T-cell filter geometry briefly described with reference to FIG. 2, with similar results indicating uniform damage in all the electrodes.

As seen in the inset, TFR device 295 is enclosed within a chamber or enclosure 296 that is held at a temperature different from the ambient or room temperature of the environment in which the test is performed. Temperature around device 295 may be controlled by a suitable temperature control means 297 that is well known in the art, such as a Lindberg furnace.

After several of these initial experiments, it was evident that the frequency of the input power signal appeared to be a crucial parameter. In fact, for a given input power, both top electrodes 280 and 285 were damaged after only a few hours, if the excitation frequency of the input power corresponded to the 'zero' resonance of the TFR device 295. In contrast, if the input power had the frequency of the 'pole' resonance, the time to failure increased by one order of magnitude, and only the electrode 285 connected to the RF source 245 was damaged.

An understanding and recognition of this frequency selectivity is paramount for accurate high power reliability tests. First, it implies that the window for damaging the device will be narrow, based on the quality factor Q of the resonator device. The factor Q measures the width of the resonance, where Q=f/Df, Df being the window in frequency within which the electrical properties of the device are affected by the resonance, and f being the frequency at which resonance occurs. For these devices, typically Q is about 500 and f is equal to about 2 GHz, so Df=f/Q=4 MHz. Even when a correct frequency is apparently selected (the inventors found that damage to the device was produced only if they input power was within this narrow window, hence, the "correct frequency"), factors such as temperature and existing electromigration damage (as will be described below) may change the zero resonance of the device 295, rendering the original, assumedly correct frequency selection inadequate.

Figure 6A:
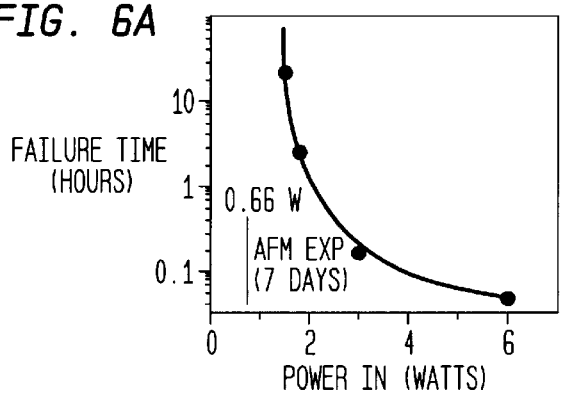
FIG. 6(a) illustrates failure time of a TFR device.
Figure 6B:
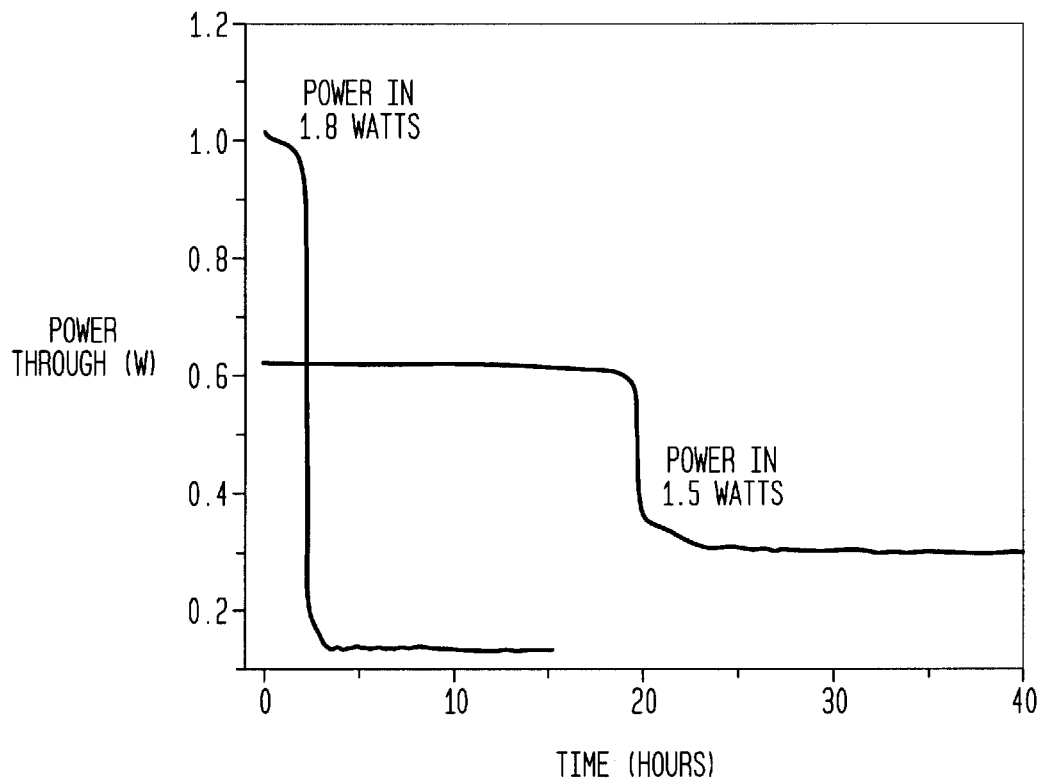
FIG. 6(b) illustrates power through as a function of failure time for a TFR device subject to two differing input power values.

FIG. 6(a) illustrates failure time of a TFR device. FIG. 6(b) illustrates power through as a function of failure time for a TFR device subject to two differing input power values. The device's time to failure is seen as a step in the power through. FIG. 6(a) thus illustrates the dependence of the failure time on the initial power through the device.

With the above caveat regarding frequency selectivity, experiments were performed at a constant frequency of the input power. Because in this initial experiment it was desired to test the devices under the worst possible conditions, the 'zero' resonant frequency $f_z$ for device 295 was chosen in advance for these experiments. Additionally a constant power was applied at $f_z$ and the power through the device was read as a function of time, with the results shown in FIG. 6(b) for two selected input power levels.

Referring to FIG. 6(b), it can be seen that after a given time, there is a noticeable, abrupt drop in the power through, from the initial value to a lower stationary one. For reasons of clarity, only two curves are presented in FIG. 6(b); however, all the resultant curves presented the same feature. Further, a simultaneous video recording using both a CCD camera and a VCR illustrated that the electromigration damage was continuous in time. In other words, although the electrical properties of the device forecast a catastrophic behavior, nothing abrupt is detected in the simultaneously recorded VCR images. One possible explanation for this may be due to a perceived continuous percolation transition in the electrode resistance. In fact, the electromigration is a continuous degradation of the electrodes, manifested by the creation and growth of voids. This degradation will continually degrade the electrode's resistance until it reaches a critical value.

In FIG. 6(a), the failure time of the device is illustrated, as defined by the drop in power through as a function of the input power. It can be seen that the curve appears to diverge to very long times (about 10 hours and up) for a Power IN less than about 1.5 W. In fact, damage has been found in the electrodes after 170 hours of measurements at a power as low as 0.66 W. Further, previously performed experiments have determined that Al strips show no electromigration below a threshold current density of $J_c=1.6\times10^5$ A/cm$^2$. Accordingly, by taking 0.66 W as the lowest value of input power in which electromigration was detected, and assuming a uniform distribution of current in the electrode, a critical current density value of $J_c=3\times10^5$ A/cm$^2$ was determined, in agreement with previously obtained results.

The results shown in FIGS. 6(a) and 6(b) demonstrate that electromigration may be a serious problem when using TFR devices in various applications. Consider the use of TFR filters as duplexers in cellular and PCS phones, for example. In such an application, the TFR should be able to handle about 1.5 W at 100° C. (it is noted that this temperature decreases the expected failure time by a factor of five, as will be described more fully below) for a period of time estimated to be about 200 hours (assuming an average use of 500 minutes per month and an life expectancy of 2 years). Clearly, as shown in FIG. 6(a), this expected long life is not achieved by current TFR devices.

As evident from above, electromigration damage is a process continuous in time, but another equally important issue is the spatial distribution of the damage in the electrodes. The inventors have observed that the deterioration starts from the edges of the electrodes inward.

Figure 7:
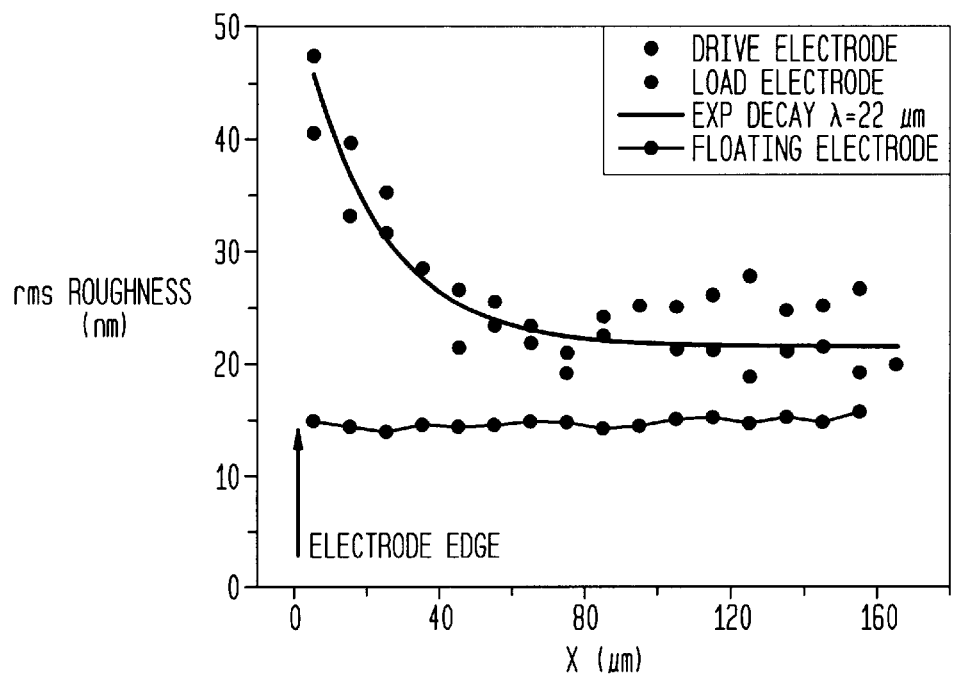
FIG. 7 illustrates root-mean-square (RMS) roughness as a function of the distance from the edge of an electrode for several electrodes.

FIG. 7 illustrates root-mean-square (RMS) roughness as a function of the distance from the edge of an electrode for several electrodes. To quantify the spatial distribution of the damage, roughness measurements using an Atomic Force Microscope (AFM) were performed. FIG. 7, the RMS roughness as a function of the distance from the edge of the electrode can be seen for the damaged electrodes (drive and load, those electrodes connected to a power source or under power) and an undamaged, unused floating electrode. From FIG. 7, it can be seen that the damage decreases from the electrode edge with an exponential decay (bold line).

Figure 8A:
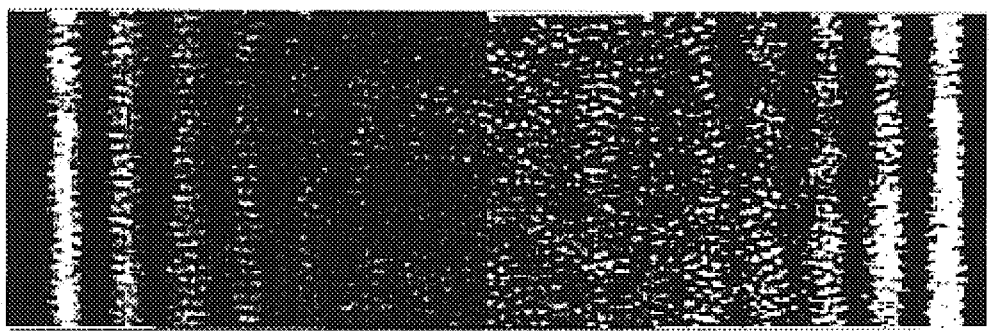
FIG. 8(a) is an AFM image of the transversal stationary acoustic modes in a TFR device.
Figure 8B:
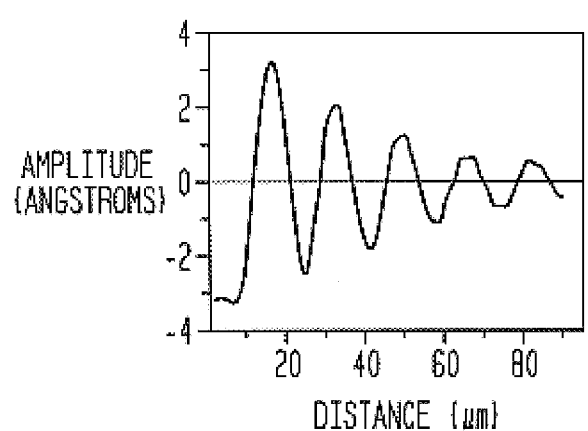
FIG. 8(b) is a profile of the transversal displacements of FIG. 8(a)
Figure 8C:
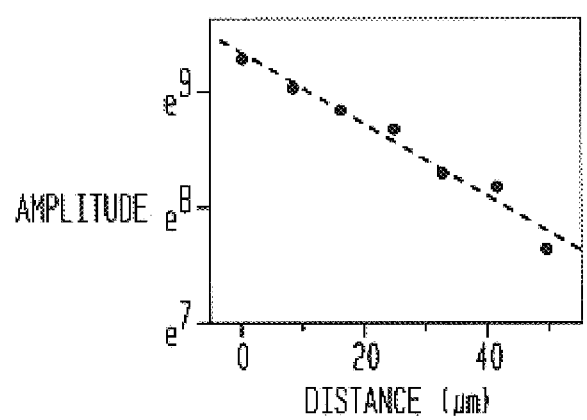
FIG. 8(c) illustrates the amplitude of the wave in FIG. 8(b) as a function of the distance from the edge of an electrode in an exponential scale.

Moreover, observation of the stationary acoustic vibration modes of the current TFR device by the inventors have indicated the same exponential decay from the edges. FIG. 8(a) is an AFM image of the transversal stationary acoustic modes in a TFR device; FIG. 8(b) is a profile of the transversal displacements of FIG. 8(a); and FIG. 8(c) illustrates the amplitude of the wave in FIG. 8(b) as a function of the distance from the edge of an electrode in an exponential scale.

In FIG. 8(a), an image of these acoustic modes is seen in a false color image. In this image, the dark regions represent sectors of the device that have a minimal amplitude of mechanical vibration, while the clear regions represent sectors with maximal amplitude. This image was obtained using an AFM-based technique.

FIG. 8(a) shows how the amplitude of vibration changes as a function of the edge of the device. It is seen that the amplitude of vibration decreases to very small values when the center of the device is reached. FIG. 8(c) shows that, effectively, the maximum amplitude of vibration decreases exponentially as one moves away from the device's edge. From this exponential decay one can obtain a characteristic length $\lambda$ for the decay of the vibration's amplitude.

When comparing the characteristic length $\lambda$ of these exponential curves, it was found that in both cases $\lambda=22\,\mu m$. One possible explanation is that these transversal stationary acoustic modes are producing mechanical stress in the Al thin film, and could actually be furthering or advancing the electromigration effect, as was found previously.

In addition to mechanical damage of the electrodes, the electromigration process dramatically changes the electrical performance of the devices. This is illustrated in FIGS. 9(a) and 9(b), showing impedance of the TFR device before and after the initial high power reliability experiment.

In this case, the applied power was about 1.5 Watts and the corresponding failure time (i.e., time to device failure) was about 20 hours. The impedance was obtained measuring the device in a probe station by using a Vector Network Analyzer, calibrated probes and cables. One noticeable difference between FIGS. 9(a) and 9(b) is that the curve in FIG. 9(b) is shallower, and the zero and pole resonance frequencies are not so clearly defined. After modeling this TFR device with a well-known Butterworth Van Dyke model (BVD) that was modified by including the effect of the electrical resistance of the electrodes, it was concluded that the change in impedance can be attributed to an increase in the resistance of the Al electrodes, an increase that was expected from the observed electromigration damage.

Figure 9A:
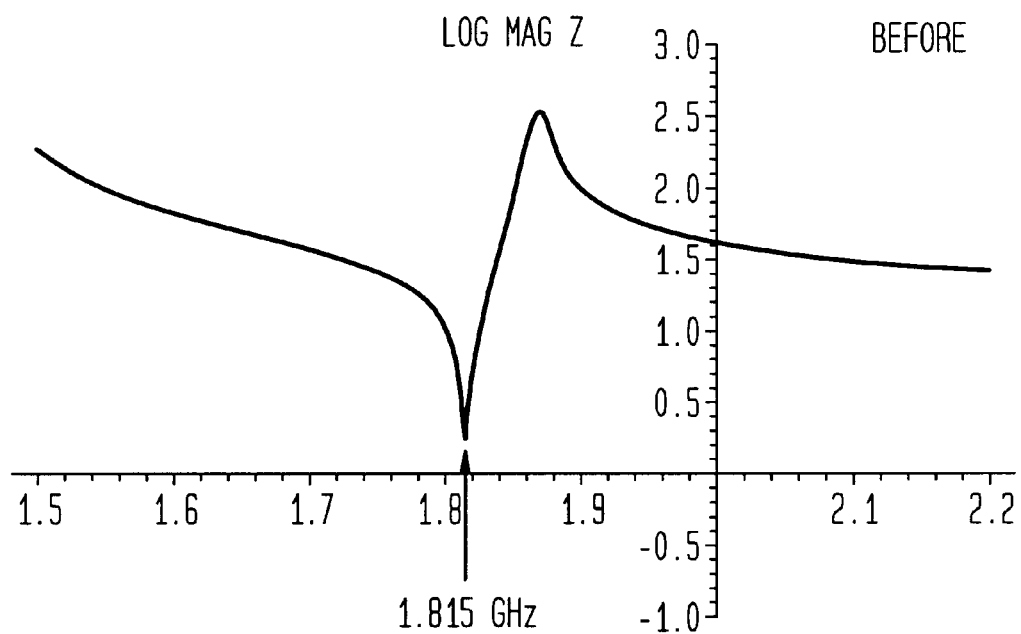
FIG. 9(a) illustrates impedance of a TFR device before electromigration damage.
Figure 9B:
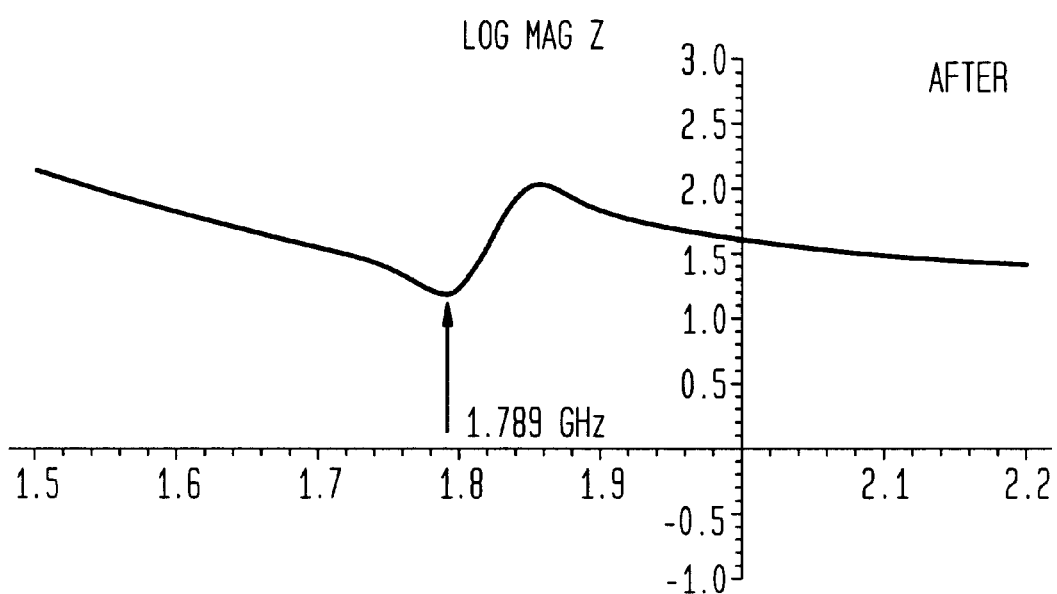
FIG. 9(b) illustrates impedance of the TFR device in FIG. 9(a) after electromigration damage.

Another difference between FIGS. 9(a) and 9(b) is that the frequencies of the resonant zero and resonant pole are reduced by about 26 MHz after the damage occurs. Changes in any of the resistances involved in the BVD model could not account for such a reduction of the resonant frequencies. Instead, such a change was obtained by increasing the thickness of the TFR device by approximately 30 nm, which is exactly the thickness of the electrodes in the TFR device tested. One possible explanation for this is that after electromigration damage, the thickness of the electrodes is effectively increased by a factor of two. Thus, the boundary conditions (i.e., the boundary conditions that set the resonant frequency based on the thickness of the device) for the stationary sound wave have changed after electromigration damage, by 'increasing' the effective thickness of the electrode by a value greater than the initial thickness. This effect was observed in all TFR devices tested.

It is known that electromigration is a thermally activated process. This fact opens the door to "accelerated" tests which may be performed on TFR devices at higher temperatures, as compared to testing the device at standard operating conditions. Extrapolation of failure rates from such accelerated tests can be done by assuming an Arrhenius behavior for the failure time (i.e., assuming that the failure time decreases exponentially as the temperature is increased). Accordingly, a second accelerated test has been devised by the inventors, in which the TFR device can be held at a controlled temperature, from ambient up to several hundred degrees C.

Figure 10:
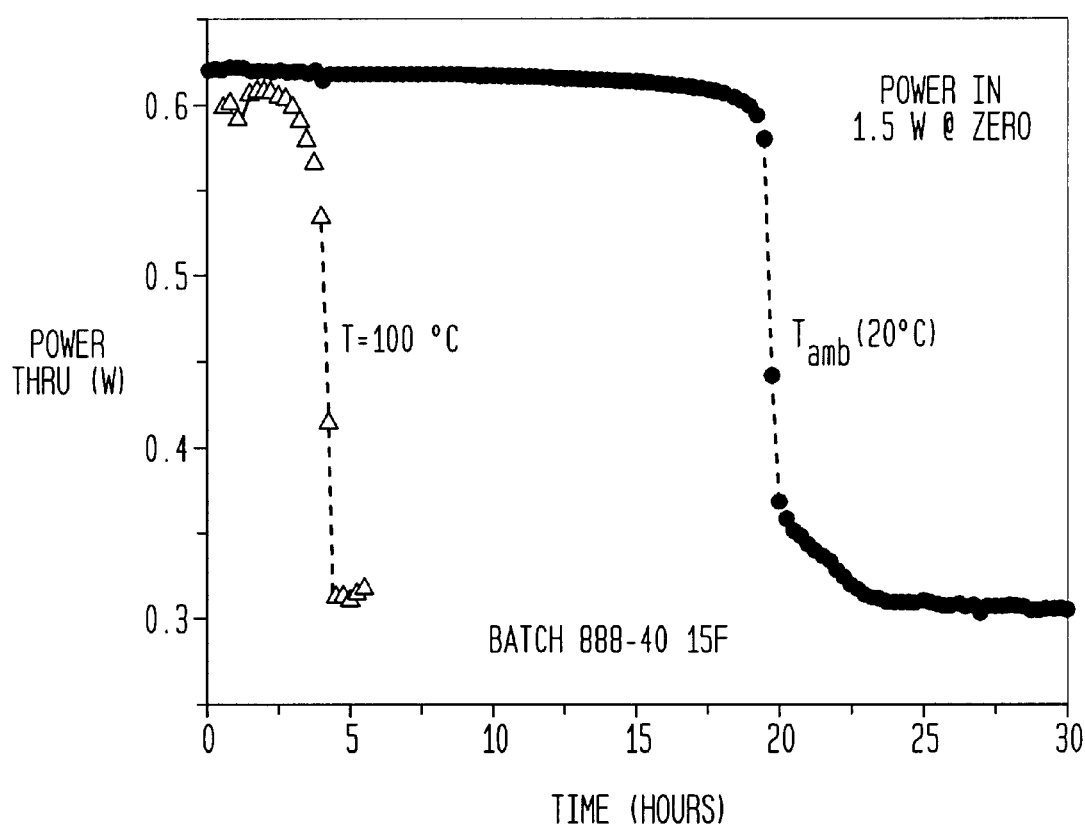
FIG. 10 illustrates power through as a function of failure time for two TFR devices at differing ambient temperatures.

FIG. 10 illustrates power through as a function of failure time for two TFR devices tested at differing ambient temperatures. In FIG. 10, results are shown for two TFR devices taken from the same batch (888–40 15 F) for an input power of 1.5 W, both at ambient temperature, and at 100° C. From these curves, it can be seen that the failure time is reduced by a factor of about five (5) when the sample is held at 100° C. This reduction in the lifetime is particularly important for the following discussion of expected device performance, since TFR devices will frequently operate at temperatures well above 25° C.

As shown in FIG. 9(b), one of the effects of electromigration damage is that the 'zero' and 'pole' frequencies are reduced by almost 30 MHz after completion of the initial reliability test. However, if the 'zero' frequency of the TFR device moves during the experiment, then the input power (having a frequency fixed at the initial resonant zero of the TFR device) is not continuously applied such that it could cause damage to the electrodes.

This situation of moving or changing frequency has yet to be utilized in known electromigration reliability experiments. In fact, the conventional experiments involve applying a dc or ac current at a fixed frequency. However, and as has been shown above, the inventors have found that electromigration damage strongly depends on the frequency of the applied power.

Therefore, the method in accordance with the present invention is now described, developed in an effort to solve the aforementioned deficiencies. Specifically, a high power reliability test is proposed in which the frequency of the input power is swept in a wide enough range of frequencies such that the input power is continuously applied to the operational frequency band of the TFR device, across the entire band or in at least of portion thereof, and including the resonant zero frequency of the TFR device. This procedure has an added advantage in that it is performed at frequencies closer to the normal operational frequencies of TFR devices used in a many wireless and/or microelectronic applications. This is significant in that the determined failure times will be more realistic.

Figure 11:
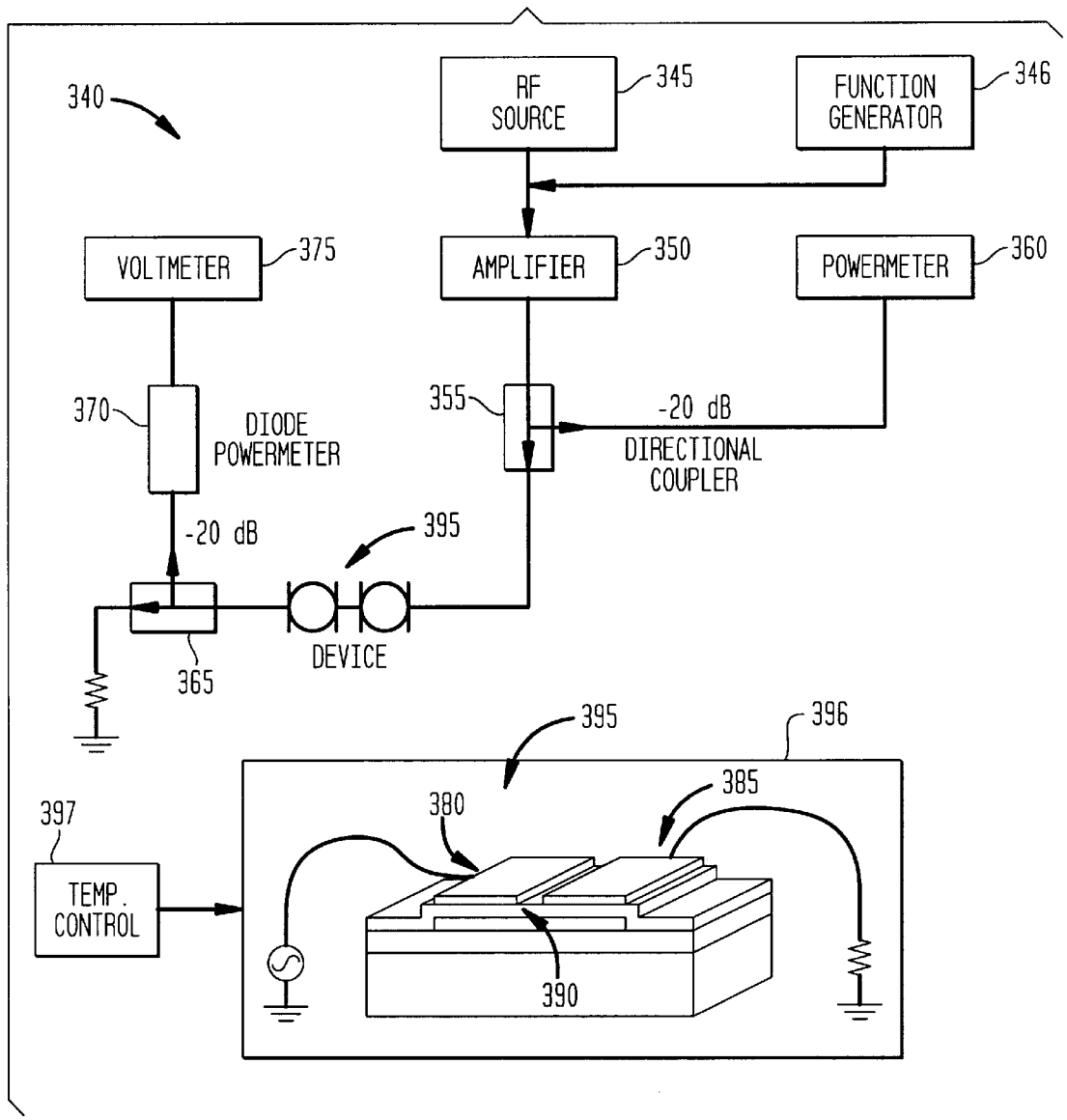
FIG. 11 illustrates the apparatus used to determine high power reliability of TFR devices in accordance with the present invention.

FIG. 11 illustrates the apparatus used to determine high power reliability of TFR devices in accordance with the method of the present invention. The testing apparatus 340 of FIG. 11 is similar to that in FIG. 5, and includes an RF source 345, amplifier 350, power meter 360, multimeter 375 (or voltmeter), directional couplers 355 and 365, diode power meter 370, testing a TFR device 395 within a temperature controlled enclosure 396, all of which are configured like, and operate similar to that described above with reference to FIG. 5.

However, to produce the sweeping of the frequency, the frequency of the input power signal generated from RF source 345 is modulated with a triangular wave of 10 KHz. This wave is provided by a function generator 346, which may be a Synthesized Function Generator Stanford DS345 for example, but could be any type of known function generator which could produce the above frequency modification. Because the input power is now modulated in frequency, the voltage measured by the diode power meter 370 has the frequency of the modulating wave, so that the voltage measured by multimeter 375 is. In other words, this means that the high-power reliability test can be performed in two alternative, but consistent ways.

Specifically, in one aspect the ac voltage output from the diode power meter 370 may be monitored on multimeter 375 while the frequency of the input power is continuously swept in frequency by function generator 346. This method has the advantage of simplicity, but also a possible disadvantage in that the measured ac voltage may not be easily related to the actual power through the device, but instead may be proportional to the derivative of power through the device with respect to the applied frequency. To account for this, and in the alternative, the input power frequency modulation provided by function generator 346 may be momentarily interrupted in order to perform a true and accurate through power measurement at a fixed (arbitrary) frequency of the input power.

Figure 12:
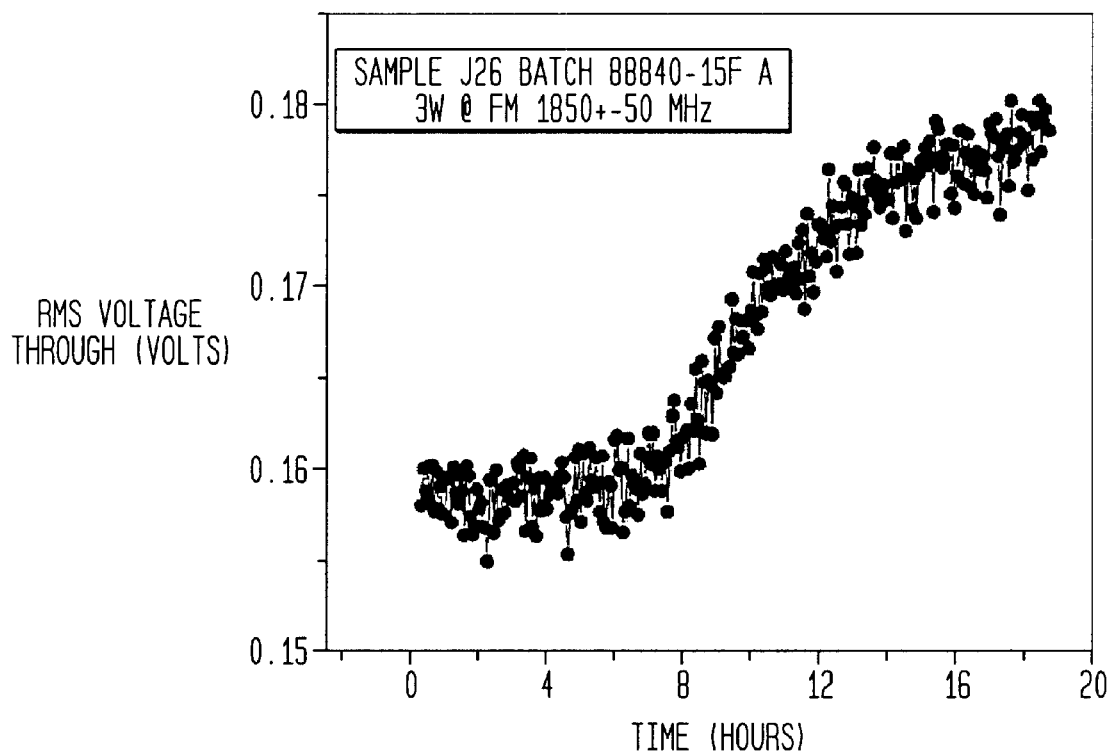
FIG. 12 illustrates RMS voltage through verses time for the TFR device of FIG. 6.

FIG. 12 illustrates RMS voltage through verses time for the TFR device tested in FIGS. 6(a) and 6(b). In FIG. 12 an exemplary result obtained is depicted for an experiment of a sample TFR device that belongs to the same batch used in the initial reliability experiment (see FIG. 6(b)). The parameter used in this test include an input power of 3 W, and the frequency of the input power was modulated at 10 KHz, from 1800 to 1900 MHz.

Referring to the curve in FIG. 12, it can be seen that the failure of the device by modulating the frequency of the input power occurred after about 8 hours while, if the power is applied at fixed frequency, the failure would occur after only about 6 minutes (see FIG. 6(a), where 6 minutes may be estimated from the plot of failure time versus input power). This apparently longer mean life arises from the fact that in this test, since frequency is being swept, the TFR device is not being continually damaged. The failure time of the TFR device appears wider and less prominent in FIG. 12 because, by using the method of sweeping or modulating frequencies, the ac voltage output of the diode power meter 370 is of a value that effectively averages the device's behavior over a wider frequency band.

The TFR device in accordance with the present invention, and which has been developed based on the results of the above method, is now described. The electromigration problem is a major reliability concern in Si large-scale integration technology, at least for the reason that many meters of Al interconnect material are required to make a single integrated circuit. Several remedies were invented in an attempt to counter-balance the electromigration problem, such as: (a) alloying Cu to Al; (b) adding a diffusion barrier to stop void growth; and (c) adding layers of TiN to improve the electromigration resistance. In the best of cases, these solutions lead to an improvement of only about 3 or 4 times in terms of extending the time to failure of the TFR device.

Figure 13:
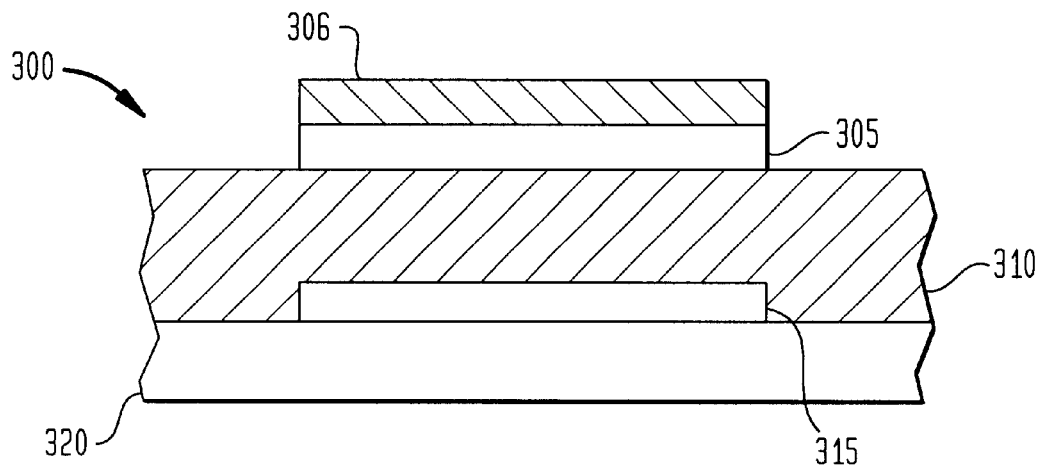
FIG. 13 is a side view of a the TFR device in accordance with the present invention.

FIG. 13 is a side view of the TFR device in accordance with the present invention. In an effort to negate the electromigration-induced failure in TFR devices, the inventors have designed, built and tested a TFR device 300 that is one of the subjects of the present invention.

As seen in the side view of FIG. 13, TFR device 300 includes a piezoelectric material 310 interposed between two conductive films such as electrode layers 305 (top) and 315 (bottom), with electrode layer 315 formed on a support structure 320. The support structure 320 may be a membrane, or may be a plurality of alternating reflecting layers on a solid semiconductor substrate which may be made of silicon or quartz, for example. The piezoelectric material is preferably one selected from the group comprising at least ZnO, CdS and AlN, and is typically isolated to reduce the amount of acoustic energy which propagates in a lateral direction away from the device. Electrode layers 305 and 315 are formed from a conductive material, preferably of Al, but may be formed from other conductors or metal alloys thereof as well.

However, and unlike the conventional TFR device such as is illustrated in FIG. 1, the top metallic electrode layer 305 includes a protective film layer 306 on top electrode layer 305. This protective layer (or electromigration-reducing layer) protects the electrode against the effects of electromigration damage, since it is of a material that is preferably mechanically harder than the top electrode layer 305. In one embodiment, the top modified electrode layer may be composed of a layer of Al having a thickness in a range of about 50–200 nm, with a layer of Ti on top of the Al layer having a thickness in the range of about 25–100 nm. However, the TFR device of the present invention is not limited to these dimensions or materials.

Figure 14:
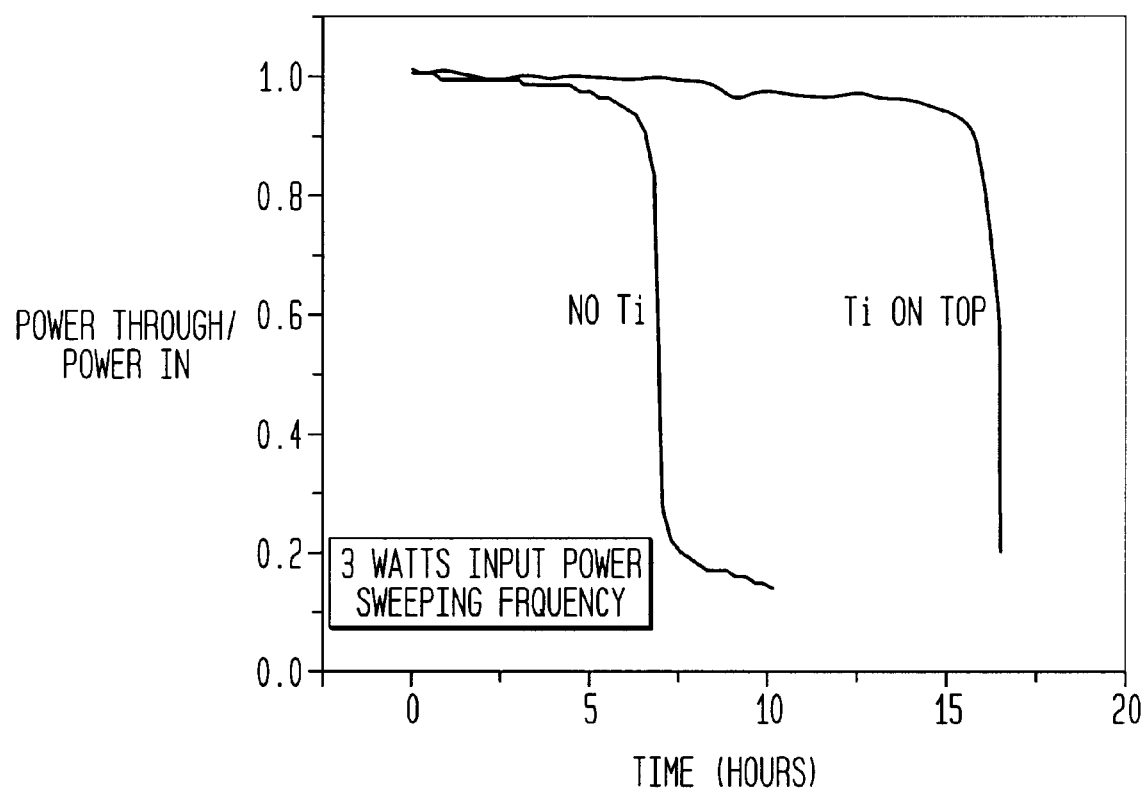
FIG. 14 illustrates power through as a function of failure time for the conventional TFR device and the TFR device of the present invention.

FIG. 14 illustrates power through as a function of failure time for the conventional TFR device with no-Ti (hereinafter $TFR_1$) and the TFR device of the present invention with the electromigration-reducing or protective film Ti on top (hereinafter $TFR_2$), after being subjected to the high-power reliability test of the present invention. For the test, an input power of 3 W, at a frequency that is modulated in a 100 MHz range centered in the resonant zero of the TFR devices were used as parameters. Referring to FIG. 14, it can be seen that the time to failure for $TFR_2$ has increased by a factor of approximately three, compared to the conventional TFR device with Al electrodes only, $TFR_1$.

Additionally to compare these different samples, the critical current density was calculated for each TFR device, so as to obtain a result independent of the thickness of the top electrode. After these calculations, the critical current density for $TFR_2$ was calculated as $J_c=1.3\times10^6$ A/cm$^2$, which is an improvement by a factor of about five (5) over the critical current density measured in $TFR_1$. In other words, this means that $TFR_2$ can operate at higher power levels for a longer time, since it takes that much longer (as seen above about 10 hours) before reaching the critical current density above which damage due to electromigration occurs.

Further in, FIG. 14, the curves illustrated are curves obtained by using the method in which the frequency modulation is stopped for a short moment to perform a true through power measurement. The failure is characterized by a sharp drop of the power through the device.

It should be noted that the comparison shown in FIG. 14 is not completely accurate because the thickness of the top electrodes in the test was different for both devices. However, the new generation of TFR devices in accordance with the invention has a top electrode three (3) times thinner than the conventional, non Ti-containing Al electrodes in current TFR devices. As a result, the difference in failure time would actually be even greater when comparing a $TFR_1$ and $TFR_2$ having the same top electrode thickness.

Moreover, reliability tests were also conducted for lower levels of input power in the $TFR_2$ device. For a given input power level of 2 W, the frequency was swept at 100 MHz centered in the resonant zero of the device, and the device's temperature was held at 100° C. After 192 hours of continuous operation, the device was still working and did not show any evidence for electromigration damage in the electrodes. This final result appears to be positive evidence that TFR devices with Ti/Al electrodes may meet the requirements expected for wireless devices, as discussed above.

Therefore, the initial reliability experiments above illustrate that the effects of electromigration lead to damage of the Al electrodes of a TFR device in only a few hours, for an input power that is within the range of work of these devices. It has been determined that this failure is sensitive to the frequency of the input power, since the damage has been quantified using different such measuring techniques as AFM measurements, electrical measurements and SEM images, for example.

Additionally, and due to the influence that the frequency selectivity has on the electromigration effect, the high power reliability testing method of the invention has been developed so as to compare different TFR device samples. This testing method is insensitive to the frequency of operation, and could become the standard procedure when testing for high power reliability of TFR devices.

Further, and based on the results of testing, a possible solution to negating or avoiding the effects of electromigration has been described in the present invention. That is, a TFR device that is fabricated or provided with a layer of Ti on top of the Al electrode, since the combination Ti/Al electrode appears substantially immune to the effects of electromigration, as shown above. Moreover, these improved devices should meet the expected power handling/lifetime requirements for TFR devices such as duplexer filters that are used in a variety of wireless and/or microelectronic applications.

The invention being thus described, it will be obvious that the same may be varied in many ways. For example, this method has been primarily described with reference to TFRs. However, this method is applicable to any type of electronic device that has a resonant frequency at which the properties of the device change (e.g. the electrical impedance), and that is designed to operate in a frequency window around that resonance. Devices like these may be all types of filters and resonators (such as Surface Acoustic Wave filters), but also inductors, capacitors, etc. Further, the method may be applicable to devices that do not have a resonant frequency as defined above for TFR's, but which are designed to operate in a certain frequency window, such as transmission lines.

Additionally, other materials may be used instead of titanium as the electromigration-reducing layer, such as W, TiN, $Si_3N_4$, for example. Further, instead of having a pure Al electrode, other conductive films may be used, such as an alloy containing impurities that might help to slow down the electromigration process. Examples of such metallic alloys, which are not limited to only Al-based alloys, may be Al—Cu and Al—Si alloys.

Moreover, an although the changing of input power frequency above has been described as sweeping the frequency across the operational frequency band of the electronic device, the input power frequency may be changed or modified by methods such as oscillation, hopping around across the entire operational band or within a portion thereof, and/or changing the frequency by a spread spectrum process, from the center frequency of the operational band outward in either direction, for example. Such variations are not to be regarded as a departure from the spirit and scope of the invention, and also to modifications as would be obvious to one skilled in the art or intended to be included within the scope of the following claims.

What is claimed is:

1. A method for determining reliability of an electronic device having an operational frequency band, comprising:

applying an input power at a frequency to the device;

changing the frequency of the applied input power in a specified frequency range, so that the input power is applied to the operational frequency band of the device; and determining a measure of reliability for the device.

2. The method of claim 1, wherein said measure of reliability is determined independent from the frequency of the input power.

3. The method of claim 1, wherein said step of changing includes sweeping the frequency of the input power across a range of 1800–1900 MHz.

4. The method of claim 3, wherein said frequency of the input power is modulated with a 10 KHz triangular wave.

5. The method of claim 4, wherein said triangular wave is provided by a function generator to modulate the frequency of the input power.

6. The method of claim 1, wherein said step of determining includes monitoring an ac voltage output while the frequency of the input voltage is continuously swept in frequency.

7. The method of claim 1, wherein said step of determining includes momentarily interrupting the frequency modulation of the input power to perform an accurate through power measurement of the input power.

8. The method of claim 7, wherein said measure of reliability is a time to device failure that is determined by at least a function of the measured through power, or by detecting electromigration with optical means, or by determining roughness of device electrodes with an SEM or AFM microscope.

9. The method of claim 1, wherein said electronic device is held at a temperature different from the ambient temperature of the environment in which the method is performed.

10. The method of claim 1, wherein said electronic device is a thin film resonator device (TFR).

11. The method of claim 10, wherein said TFR device is configured in a resonator and/or filter structure.

12. The method of claim 1, wherein said operational frequency band includes a resonant pole and a resonant zero frequency.

13. An apparatus for determining reliability of an electronic device having an operational frequency band, comprising:

an RF source for applying an input power at a frequency to the device;

a function generator for changing the frequency of the applied input power in a specified frequency range, so that the input power is applied to the operational frequency band of the device; and a multimeter for measuring the power through the device so as to determine a time to device failure.

14. The apparatus of claim 13, further comprising a first directional coupler and power meter connected between the RF source and device, and configured so as to read the input power.

15. The apparatus of claim 13, wherein the input power is supplied to the device through an RF amplifier.

16. The apparatus of claim 14, further comprising a second directional coupler and diode power meter connected between the device and multimeter, and configured so that voltage through the device is read on the multimeter.

17. The apparatus of claim 13, wherein said function generator modulates the frequency of the input power with a 10 KHz triangular wave, so that the frequency of the input power is swept across a range of 1800–1900 MHz.

18. The apparatus of claim 13, wherein the multimeter monitors ac voltage through the device while the frequency of the input power is continuously swept in frequency by the function generator.

19. The apparatus of claim 13, wherein frequency modulation provided by the function generator is momentarily interrupted to perform an accurate through power measurement of the input power in order to determine failure time of the device.

20. The apparatus of claim 13, wherein said electronic device is configured within an enclosure that is held at a temperature different than the ambient temperature at which the apparatus operates.

21. The apparatus of claim 13, wherein said electronic device is a thin film resonator device (TFR).

22. The apparatus of claim 21, wherein said TFR device is configured in a resonator and/or filter structure.

23. The apparatus of claim 13, wherein said operational frequency band includes a resonant pole and a resonant zero frequency.

* * * * *